United States Patent
Kaga et al.

(10) Patent No.: US 7,948,075 B2
(45) Date of Patent: May 24, 2011

(54) SILICON NITRIDE SUBSTRATE, METHOD OF MANUFACTURING THE SAME, AND SILICON NITRIDE CIRCUIT BOARD AND SEMICONDUCTOR MODULE USING THE SAME

(75) Inventors: Youichirou Kaga, Kitakyushu (JP); Junichi Watanabe, Kumagaya (JP)

(73) Assignee: Hitachi Metals, Ltd., Tokyo (JP)

( * ) Notice: Subject to any disclaimer, the term of this patent is extended or adjusted under 35 U.S.C. 154(b) by 267 days.

(21) Appl. No.: 12/379,868

(22) Filed: Mar. 3, 2009

(65) Prior Publication Data

US 2009/0224399 A1    Sep. 10, 2009

(30) Foreign Application Priority Data

Mar. 10, 2008   (JP) .................... 2008-059178
Mar. 13, 2008   (JP) .................... 2008-063426

(51) Int. Cl.
    *H01L 23/00*   (2006.01)
(52) U.S. Cl. ........ 257/703; 257/705; 257/706; 257/712; 438/718; 174/137 B; 264/647; 361/688
(58) Field of Classification Search .................. 257/703, 257/705, 706, 712; 438/718; 174/137 B; 264/647; 361/688
See application file for complete search history.

(56) References Cited

U.S. PATENT DOCUMENTS

2006/0170306 A1* 8/2006 Takahashi et al. ............ 310/311
2009/0039477 A1* 2/2009 Kaga et al. .................... 257/655

FOREIGN PATENT DOCUMENTS

| EP | 1 142 849 A1 | 10/2001 |
|---|---|---|
| JP | A-61-10069 | 1/1986 |
| JP | A-61-186257 | 8/1986 |
| JP | A-11-268958 | 10/1999 |
| JP | A-2001-19555 | 1/2001 |
| JP | A-2001-335359 | 12/2001 |
| JP | A-2002-12474 | 1/2002 |
| JP | A-2002-362976 | 12/2002 |
| JP | A-2004-161605 | 6/2004 |
| WO | WO 2006/118003 A1 | 11/2006 |

OTHER PUBLICATIONS

Jun. 4, 2009 Search Report issued in European Patent Application No. 09154697.8.

* cited by examiner

*Primary Examiner* — Mary Wilczewski
*Assistant Examiner* — Telly D Green
(74) *Attorney, Agent, or Firm* — Oliff & Berridge, PLC

(57) ABSTRACT

A silicon nitride substrate having appropriately adjusted warpage and surface roughness can be obtained by mixing magnesium oxide of 3 to 4 wt % and at least one kind of rare-earth element oxide of 2 to 5 wt % with silicon nitride source material powder to form a sheet-molded body, sintering the sheet-molded body, and performing a heat treatment at a temperature of 1,550 to 1,700 degree C. with a pressure of 0.5 to 6.0 kPa with a plurality of substrates being stacked. Also, a silicon nitride circuit board and a semiconductor module using the same are provided.

8 Claims, 7 Drawing Sheets

SILICON NITRIDE SUBSTRATE, METHOD OF MANUFACTURING THE SAME, AND SILICON NITRIDE CIRCUIT BOARD AND SEMICONDUCTOR MODULE USING THE SAME

BACKGROUND

1. Technical Field

The present invention relates to a silicon nitride substrate and a method of manufacturing the same. In addition, the present invention relates to a silicon nitride circuit board and a semiconductor module using the silicon nitride substrate.

2. Description of the Related Art

Recently, in the field of an inverter for an electric vehicle or the like, power semiconductor modules (such as IGBT or a power MOSFET) capable of operating with a high voltage and a large electric current are employed. The power semiconductor module may include an insulative ceramic circuit board having a metal circuit plate on its one surface and a metal heat sink plate on the other surface. In addition, a semiconductor device is mounted on the superior surface of the metal circuit plate. The insulative ceramic substrate is bonded to the metal circuit plate and the metal heat sink plate by means of, for example, an active metal method using brazing filler metal or a direct copper bonding method in which a copper plate is directly bonded.

Since such power semiconductor module generates a large amount of heat by flowing a large amount of current, a thermal stress is generated due to a difference of thermal expansion rates between the insulative ceramic substrate and the metal circuit plate or between the insulative ceramic substrate and the metal heat sink plate. This may cause fracture that generates cracks on the insulative ceramic substrate or exfoliation of the metal circuit plate or the metal heat sink plate from the insulative ceramic substrate. The insulative ceramic substrate may be made of, for example, aluminum nitride or silicon nitride. However, since the insulative ceramic substrate made of aluminum nitride has a low mechanical strength, it may be susceptible to the cracks or exfoliation, so that may not be suitable to be used in the power semiconductor module.

In this regard, Japanese Patent Application Laid-Open (JP-A) No. 11-268958 discloses an example of a sintered silicon nitride substrate. According to the patent document, an inner layer of the substrate has a fine grain structure, and an outer layer has a combinational structure containing both coarse and fine grains, thereby improving strength and toughness. Japanese Patent Application Laid-Open (JP-A) No. 61-186257 discloses a silicon nitride ceramic structure, in which sizes of ceramic grains contained in a surface layer are larger than the sizes of the ceramic grains contained in an inner layer, thereby improving strength. In Japanese Patent Application Laid-Open (JP-A) No. 61-10069, fine powder of magnesium carbonate $MgCO_3$ or magnesium hydroxide $Mg(OH)_2$, which is thermally decomposed into magnesium oxide MgO, is used as a sintering additive for forming grain boundary phases, thereby obtaining a sintered body having grain boundary phases regularly diffused. Thus, strength is improved and strength difference is reduced. In Japanese Patent Application Laid-Open (JP-A) No. 2004-161605, a number of sintering additive components are previously mixed and regularly diffused, and then, silicon nitride powder as a main source material is mixed with them, so that a sintered body having high strength with suppressed agglomeration or segregation can be obtained.

However, the techniques disclosed in the aforementioned documents failed to appropriately adjust warpage and surface roughness of the silicon nitride substrate. Generally, when the warpage of the silicon nitride substrate becomes large, an adhesion property of the metal circuit plate and the metal heat sink plate is degraded, so that the metal circuit plate and the metal heat sink plate may become susceptible to exfoliation from the silicon nitride substrate due to the thermal stress generated during a cooling process from a bonding temperature (at about 800 degree C.) between the silicon nitride substrate and the metal circuit plate, and between the silicon nitride substrate and the metal heat sink plate, or a heating and cooling cycle when operating the power semiconductor module. Also, when surface roughness of the silicon nitride substrate is large, the surface adhesion property of the silicon nitride substrate with the metal circuit plate and the metal heat sink plate is degraded, so that the metal circuit plate and the metal heat sink plate may become susceptible to exfoliation from the silicon nitride substrate as described above. Accordingly, it is necessary to appropriately adjust the warpage and surface roughness, but the aforementioned documents do not disclose any technique for adjusting the warpage and the surface roughness of the silicon nitride substrate. Therefore, as described above, the warpage and the surface roughness of the silicon nitride substrate cannot be appropriately adjusted.

SUMMARY

An object of the present invention is to provide a silicon nitride substrate having warpage and surface roughness appropriately adjusted, a method of manufacturing the same, and a silicon nitride circuit board and semiconductor module using the same.

According to one aspect of the invention, there is provided a silicon nitride substrate containing silicon nitride, wherein a degree of orientation representing an orientation ratio on a plane perpendicular to a thickness direction, determined by a ratio of X-ray diffraction beam intensity on a predetermined lattice surface of a grain of the silicon nitride, is 0.33 or less on a surface; and the degree of orientation is 0.16 to 0.33 on a surface obtained by grinding as deep as 20% or more of a thickness of the substrate; and warpage is 2.0 µm/mm or less. Since a surface bonded to a metal plate is necessary to satisfy such requirements on the degree of orientation, it may satisfy the requirements for both surfaces of the silicon nitride substrate.

According to another aspect of the invention, there is provided a silicon nitride substrate containing β-type silicon nitride, yttrium Y, and magnesium Mg, wherein a variation coefficient representing distribution of magnesium on a surface of the silicon nitride substrate is 0.20 or less, and warpage is 2.0 µm/mm or less. Since a surface bonded to a metal plate is necessary to satisfy such requirements on the variation coefficient, it may satisfy the requirements for both surfaces of the silicon nitride substrate.

According to another aspect of the invention, there is provided a method of manufacturing a silicon nitride substrate, the method including: mixing magnesium oxide of 3 to 4 wt % and at least one kind of rare-earth element oxide of 2 to 5 wt % with silicon nitride source material powder to form a sheet-molded body; sintering the sheet-molded body; and performing a heat treatment at a temperature of 1,550 to 1,700 degree C. with a pressure of 0.5 to 6.0 kPa with a plurality of substrates being stacked.

DESCRIPTION OF THE EXEMPLARY EMBODIMENT

Figure 1A:
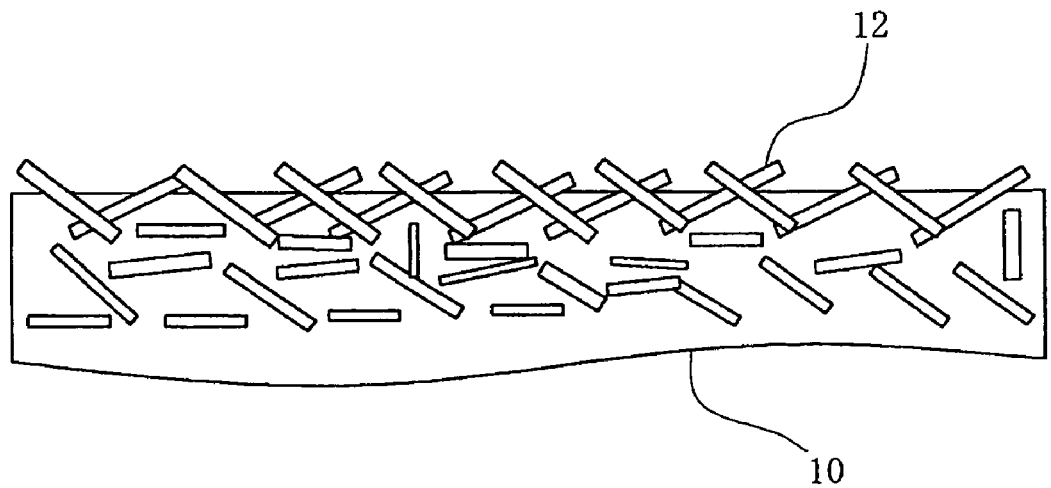
FIGS. 1A and 1B are illustrative diagrams showing a relationship between a degree of orientation and a longitudinal length of a columnar grain.

An exemplary embodiment of the present invention (referred to as "an embodiment" below) will be described hereinafter.

First Embodiment

According to a first embodiment of the present invention, there is provided a silicon nitride substrate which is an insulative ceramic substrate used in a semiconductor module or the like, wherein the silicon nitride substrate contains silicon nitride $Si_3N_4$, a degree of orientation representing an orientation ratio on a surface perpendicular to a thickness direction, determined by a ratio of each X-ray diffraction beam intensity on a predetermined lattice surface of the silicon nitride grains, is set to 0.33 or less, and the degree of orientation is set to 0.16 to 0.33 on the surface obtained by grinding as deep as 20% or more of the substrate thickness. The warpage of the silicon nitride substrate is 2.0 μm/mm or less.

Here, the substrate surface refers to the outermost surface of the silicon nitride substrate obtained after a heat treatment process (d), which will be described later, i.e., the surface before grinding when the silicon nitride substrate is manufactured, or the surface obtained by grinding as deep as 10% or less of the substrate thickness (15 (μm at maximum) from the outermost surface.

The degree of orientation fa can be represented as follows:

$$fa = (P - P0)/(1 - P0) \quad (1)$$

In above Equation (1), P denotes a ratio of the X-ray diffraction beam intensities on each of the plane (110), the plane (200), the plane (210), the plane (310), and the plane (320) of the silicon nitride grain in the silicon.nitride substrate as will be described in Equation (2) later. P0 denotes a ratio of the X-ray diffraction beam intensities on each of the plane (110), the plane (200), the plane (210), the plane (310) and the plane (320) of the silicon nitride grain in the silicon nitride substrate as will be described in Equation (3).

$$P = (I_{(110)} + I_{(200)} + I_{(210)} + I_{(310)} + I_{(320)})/(I_{(110)} + I_{(200)} + I_{(101)} + I_{(210)} + I_{(201)} + I_{(310)} + I_{(320)} + I_{(002)}) \quad (2)$$

$$P = (I'_{(110)} + I'_{(200)} + I'_{(210)} + I'_{(310)} + I'_{(320)})/(I'_{(110)} + I'_{(200)} + I'_{(101)} + I'_{(210)} + I'_{(201)} + I'_{(310)} + I'_{(320)} + I'_{(002)}) \quad (3)$$

While the silicon nitride substrate contains both coarse and fine columnar grains of silicon nitride as a main component, the degree of orientation fa of the substrate surface is determined according to the orientation of the coarse columnar grains. The degree of orientation fa may range between −1 and 1. When the degree of orientation fa is 0, it is recognized that the coarse columnar grains are distributed in a disorderly manner. When the degree of orientation fa is larger than 0 as in the silicon nitride substrate according to the present embodiment, it is recognized that the silicon nitride substrate contains a larger content of columnar grains having an inclination of a long axis with respect to the thickness direction of the silicon nitride substrate larger than 45 degree. As the degree of orientation fa reaches 1, it is recognized that the inclination of a long axis with respect to the thickness direction of the silicon nitride substrate reaches 90 degree.

Figure 1B:
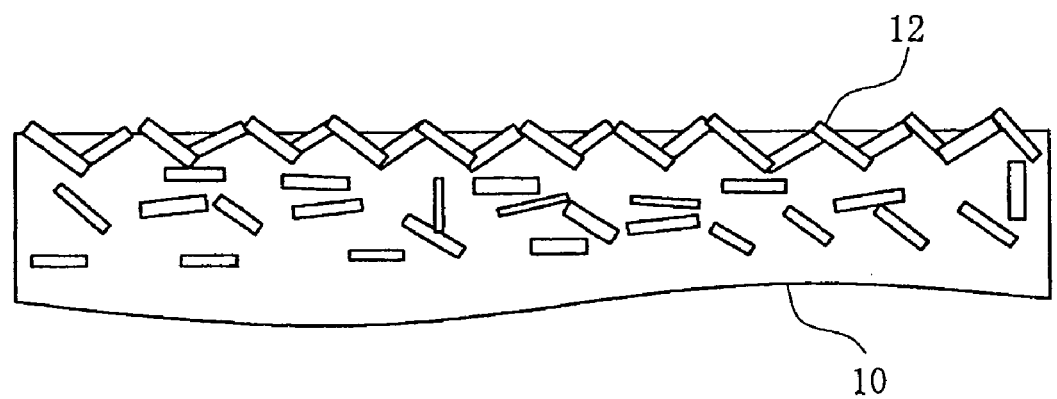

It is recognized that, when the degree of orientation fa is large, the longitudinal lengths of the columnar grains grow (i.e., become longer). Referring to FIGS. 1A and 1B, it is shown a relationship between the degree of orientation fa and the longitudinal length of the columnar grain. FIG. 1A shows a case where the degree of orientation fa is large, and FIG. 1B shows a case where the degree of orientation fa is small. Referring to FIG. 1A which shows a case where the degree of orientation fa is large, the longitudinal length of the columnar grains 12 contained in the silicon nitride substrate 10 is larger than that of FIG. 1B which shows a case where the degree of orientation fa is small. Accordingly, when the degree of orientation fa of the surface of the silicon nitride substrate 10 is large, the ratio of the long-length columnar grains 12 increases, so that the surface roughness of the silicon nitride substrate also increases. If the surface roughness increases, the adhesion property with the metal circuit plate and the metal heat sink plate is degraded when a power semiconductor module or the like is manufactured. Therefore, the metal circuit plate and the metal heat sink plate may become susceptible to exfoliation from the silicon nitride substrate 10 during a bonding process to the silicon nitride substrate 10 or a heat cycle accompanied by operation of the power semiconductor module. On the other hand, if the degree of orientation fa inside the silicon nitride substrate 10 decreases, the ratio of the long-length columnar grains 12 decreases, and bending strength, fracture toughness, or the like also decreases. As a result, the silicon nitride substrate 10 becomes susceptible to cracks during a bonding process to the metal circuit plate and the metal heat sink plate, or a heat cycle accompanied by operation of the power semiconductor module. In this case, the degree of orientation fa inside the silicon nitride substrate 10 is a degree of orientation fa of the surface obtained by grinding as deep as 20% or more of the substrate thickness as described above. Alternatively, the surface for measuring the degree of orientation fa inside the silicon nitride substrate 10 may be obtained by grinding the substrate thickness as deep as 30 μm or more from the substrate surface. In addition, if the degree of orientation fa inside the silicon nitride substrate 10 increases, then the degree of orientation fa of the surface of the silicon nitride substrate 10 also increases resulting in a problem that the surface roughness may also increase. From the reasons described above, it is necessary to appropriately adjust the degrees of orientation fa inside as well as on the surface of the silicon nitride substrate 10.

Therefore, in the silicon nitride substrate according to the present embodiment, the degree of orientation on the substrate surface is set to 0.33 or less, and the degree of orientation on the surface obtained by grinding as deep as 20% of the substrate thickness or more from the substrate surface is adjusted to 0.16 to 0.33 as described above. As a result, it is possible to reduce surface roughness of the silicon nitride substrate as well as to improve bending strength and fracture toughness. How to adjust the degree of orientation fa will be described later.

If the warpage of the silicon nitride substrate increases, the adhesion property between the silicon nitride substrate and the metal circuit plate or between the silicon nitride substrate and the metal heat sink plate may be easily degraded in some parts. As a result, the metal circuit plate and the metal heat sink plate may become susceptible to exfoliation from the silicon nitride substrate. Therefore, in the silicon nitride substrate according to the present invention, the warpage is limited to 2.0 μm/mm or less as described above. How to limit the warpage will be described later.

The silicon nitride substrate according to the present embodiment contains magnesium Mg of 3 to 4 wt % as magnesium oxide MgO and at least one kind of rare-earth element oxide of 2 to 5 wt %. Here, the rare-earth element oxide may be, for example, yttrium oxide. Since the magnesium and the rare-earth element (e.g., yttrium) function as a sintering additive for growing columnar grains of silicon nitride, the growth of the columnar grains may be insufficient, and the content of columnar grains having short longitudinal length increases when its content is small. Accordingly, the bending strength and the fracture toughness of the silicon nitride substrate decrease. Meanwhile, when the contents of magnesium and a rare-earth element increase, the growth of columnar grains is stimulated, so that the content of columnar grains having a large longitudinal length increases. Accordingly, the degree of orientation fa of the silicon nitride substrate also increases, and the surface roughness increases. In this embodiment, each of the contents of magnesium and a rare-earth element is set to the aforementioned range to adjust such properties.

Second Embodiment

According to a second embodiment of the present invention, there is provided a silicon nitride substrate, which is an insulative ceramic substrate used in the power semiconductor module or the like as described above, containing β-type silicon nitride, yttrium (Y), and magnesium (Mg), wherein a variation coefficient which represents distribution of the amount of magnesium Mg is set to 0.20 or less. The warpage of the silicon nitride substrate is set to 2.0 μm/mm or less.

The variation coefficient representing distribution of the amount of magnesium is measured by scanning an arbitrary location of the substrate surface within a range of 1 mm by irradiating an EPMA beam having a diameter of 1 μm, measuring values of an X-ray intensities of Mg with an interval of 2 μm, and dividing a standard deviation thereof by an average thereof.

The silicon nitride substrate contains grains of silicon nitride and grain boundary phases mainly containing component added as a sintering additive. The grain boundary phase generated with the sintering additive as a main component serves to retain a bonding force between the silicon nitride grains and to prevent defects between the grains. Particularly, when a coarse defect exists on the surface of the silicon nitride substrate, or when a stress is applied to the silicon nitride substrate, the defect may serve as a start point of breakdown. Therefore, it is necessary to regularly distribute the grain boundary phases to prevent a coarse defect.

Magnesium oxide MgO and yttrium oxide $Y_2O_3$ used as a sintering additive in the silicon nitride substrate react with $Si_3N_4$ or $SiO_2$ contained in $Si_3N_4$ to form a liquid phase in a sintering process. While the magnesium oxide MgO helps to generate the liquid phase at a relatively low temperate and promote the sintering process, the liquid phase containing MgO is susceptible to volatilization or segregation and is apt to irregularly distribute the grain boundary phases containing Mg generated from the liquid phase particularly on the substrate surface frequently exposed to a high temperature in a sintering process. Regularity of grain boundary phases containing Mg can be recognized by checking a variation coefficient representing distribution of the amount of magnesium Mg on the surface of the silicon nitride substrate. Accordingly, when the variation coefficient representing distribution of the amount of magnesium Mg on the surface of the silicon nitride substrate is large, a large number of coarse defects are formed on the surface of the silicon nitride substrate, then bending strength decreases, and thus, cracks may be easily generated when a stress is applied on the silicon nitride substrate during a bonding process between: the silicon nitride substrate and the metal circuit plate; and the silicon nitride substrate and the metal heat sink plate, a process of manufacturing a power semiconductor module, or a heat cycle accompanied by operation of the power semiconductor module. Accordingly, it is necessary to appropriately adjust the variation coefficient representing distribution of the amount of magnesium Mg on the surface of the silicon nitride substrate. On the other hand, distribution of the amount of yttrium Y on the surface of the silicon nitride substrate is hardly influenced by a manufacturing condition.

Therefore, in the silicon nitride substrate according to the present embodiment, the variation coefficient representing distribution of the amount of magnesium Mg is adjusted to 0.20 or less as described above. Accordingly, it is possible to improve bending strength of the silicon nitride substrate. How to adjust the variation coefficient will be described later.

If warpage of the silicon nitride substrate is large, an adhesion property between the silicon nitride substrate and the metal circuit plate or between the silicon nitride substrate and the metal heat sink plate may be easily degraded in some parts. As a result, the metal circuit plate and the metal heat sink plate may be easily exfoliated from the silicon nitride substrate. Therefore, in the silicon nitride substrate according to the present embodiment, the warpage is limited to 2.0 μm/mm or less as described above. How to limit the warpage will be described later.

The silicon nitride substrate according to the present embodiment contains magnesium Mg of 3.0 to 4.2 wt % as magnesium oxide and yttrium Y of 2.0 to 5.0 wt % (preferably, a total of 5.0 to 8.3 wt %) as yttrium oxide. In addition, it is preferable to contain magnesium and yttrium of contents to set a ratio of $(MgO)/(Y_2O_3)$ as oxide to 0.62 to 2.2. Magnesium and yttrium function as a sintering additive in a process of manufacturing the silicon nitride substrate, and usually exist as a grain boundary phase in the manufactured silicon nitride substrate, and thus, when their contents decrease, coarse defects such as voids may be easily generated, and bending strength may easily decrease. On the other hand, when the contents of the magnesium and yttrium increase, a large content of grain boundary phases, which has weaker strength comparing to the silicon nitride grains inside the silicon nitride substrate, are formed. Therefore, breakdown through a grain boundary is easily generated and then the bending strength decreases. When the ratio between contents of magnesium and yttrium is not within an appropriate range, they may not sufficiently serve as a sintering additive. As a result, the sintering of the silicon nitride substrate may not be promoted, or a weak grain boundary phase may be formed in the silicon nitride substrate, and thus, bending strength decreases. In the present embodiment, each of the contents of magnesium and yttrium is limited in the range in order to adjust such properties.

Third Embodiment

Hereinafter, a method of manufacturing a silicon nitride substrate according to the first and second embodiments will be described.

Figure 2:
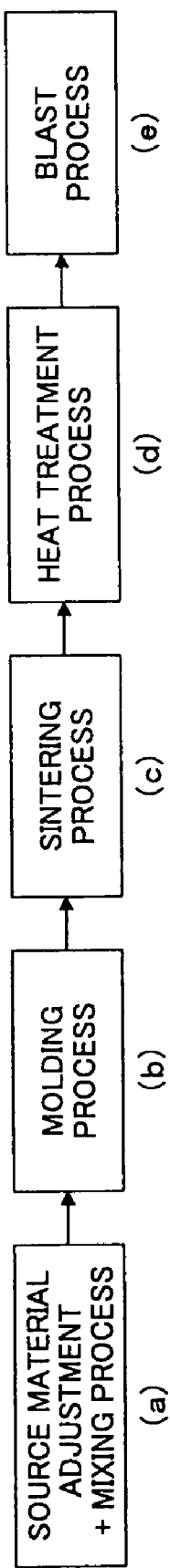
FIG. 2 is a flowchart illustrating an example of a method of manufacturing a silicon nitride substrate.

FIG. 2 illustrates a flowchart showing a method of manufacturing a silicon nitride substrate according to the present embodiment. Referring to FIG. 2, in a source material adjustment and mixing process (a), magnesium oxide of 3 to 4 wt % and at least one kind of oxide of a rare-earth element of 2 to 5 wt % are mixed with silicon nitride source material powder with a total weight percentage of 5 to 8 wt %. A solution, an organic binder, a plasticizing material, and the like are also mixed with them using a ball mill or the like. Here, it is preferable to use above-described yttrium oxide or the like as at least one kind of oxide of a rare-earth element.

Then, in a molding process (b), source material slurry obtained by the mixture is defoamed and thickened, and then, a sheet molding is performed to obtain a plate having a predetermined thickness by way of a doctor blade method known in the art. Here, the thickness of the sheet-molded body may be appropriately determined depending on its use. For example, the thickness may be set to 0.1 to 1.0 mm.

Then, in a sintering process (c), the sheet-molded body is inserted into a furnace and sintered in a nitrogen atmosphere with a pressure of 0.5 to 1.0 MPa at a temperature of 1,800 to 2,000 degree C., so as to provide a silicon nitride substrate.

Then, in a heat treatment process (d), a plurality of silicon nitride substrates obtained after the sintering process are stacked, and a heat treatment is performed at a temperature of 1,550 to 1,700 degree C. with a pressure of 0.5 to 6.0 kPa. With such a heat treatment with a pressure, it is possible to prevent warpage of the silicon nitride substrate and to regularly distribute grain boundary phases including magnesium Mg on the substrate surface, thereby improving bending strength. If the heat treatment temperature is lower than 1,550 degree C., the effect of preventing warpage becomes inefficient, and the warpage of silicon nitride substrate increases. Meanwhile, if the heat treatment temperature is higher than 1,700 degree C., growth of columnar grains contained in the silicon nitride substrate is promoted, then a degree of orientation fa of the silicon nitride substrate increases, and thus, surface roughness increases, further, vaporization or segregation of grain boundary phase components containing magnesium Mg on the surface of the silicon nitride substrate is promoted, then a coarse defect is easily generated on the substrate surface, and thus, bending strength decreases. Therefore, the heat treatment temperature is preferable to be in the above-described range. If the pressure applied during the heat treatment is lower than 0.5 kPa, the effect of preventing warpage is insufficient, and the content of magnesium oxide (MgO) decreases due to vaporization of the grain boundary phase components including magnesium(Mg), and thus, bending strength decreases. Meanwhile, if the pressure is higher than 6.0 kPa, the growth of columnar grains contained in the silicon nitride substrate is promoted, then the degree of orientation fa of the silicon nitride substrate increases, and thus, the surface roughness increases. Further, the adhesion property (contact pressure) between substrates may become excessive, then grain boundary phase components, which include magnesium, are given and received between substrates to promote segregation, and thus a coarse defect on the surface of the silicon nitride substrate is easily generated to degrade a bending strength. Therefore, the load applied in the heat treatment process is preferably within the range described above. Here, the heat treatment is performed with a plurality of silicon nitride substrate being stacked in order to adjust a vaporization amount of magnesium oxide, yttrium oxide and the like, which functions as a sintering additive, to control the growth of columnar grains contained in the silicon nitride substrate, and thus to control the degree of orientation fa of the silicon nitride substrate. Furthermore, this is for adjusting the vaporization amount of magnesium oxide as a sintering additive to control Mg contained on the surface of the silicon nitride substrate to be regularly distributed and to adjust the content of the MgO.

Then, in a blast process (e), abrasive particles are blasted on the surface of the silicon nitride substrate after the heat treatment to grind the columnar grains existing on the substrate surface so as to reduce surface roughness. The abrasive particles are blasted on both surfaces of the silicon nitride substrate.

Figure 3:
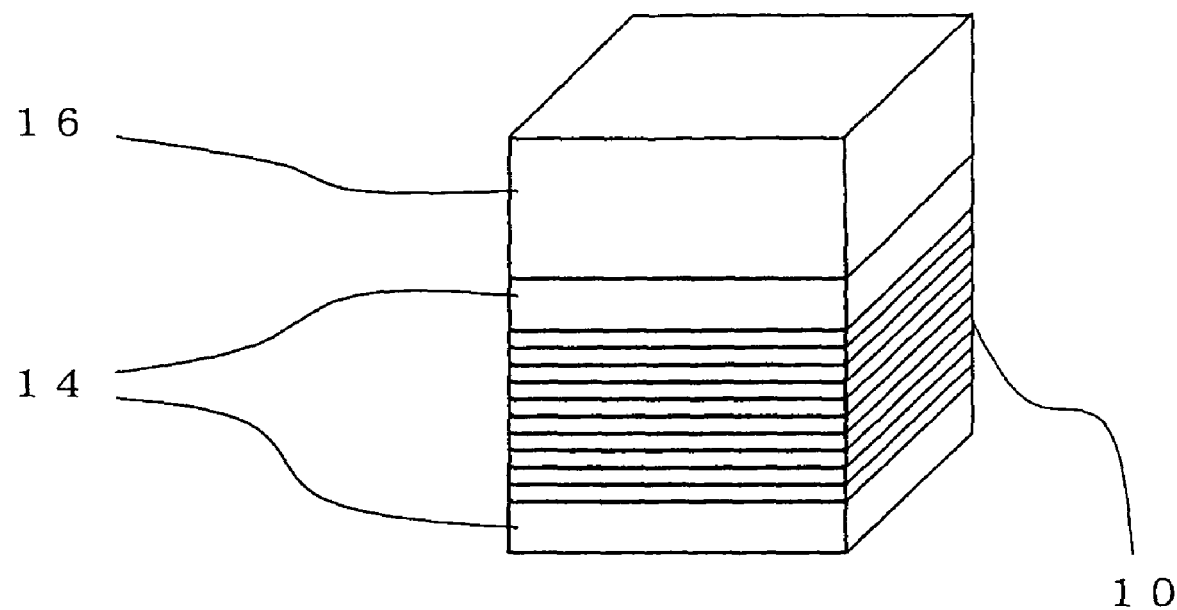
FIG. 3 is an illustrative diagram showing a method of applying a load during a thermal process of FIG. 2.
Figure 4:
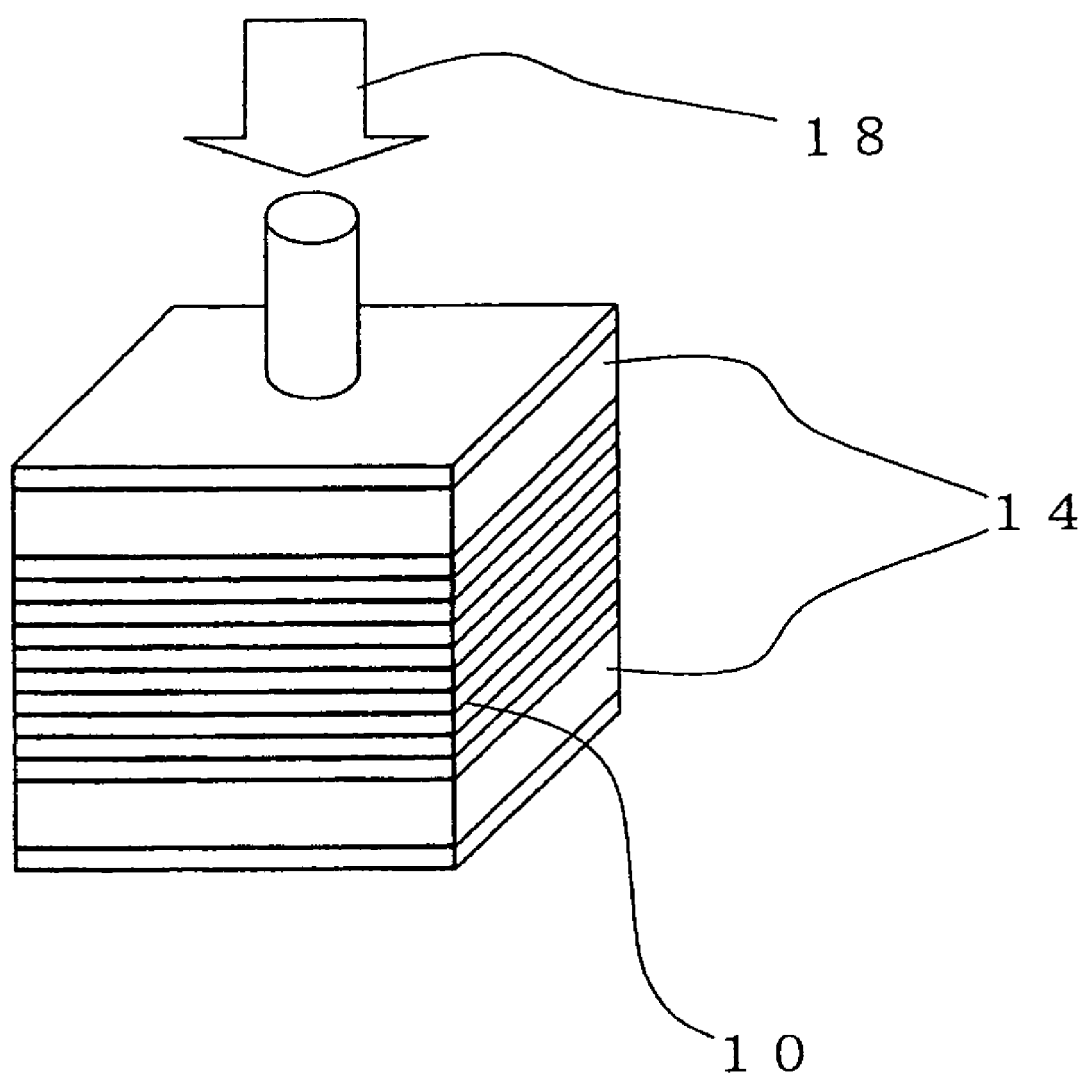
FIG. 4 is another illustrative diagram showing a method of applying a load during a thermal process of FIG. 2.

FIGS. 3 and 4 are illustrative diagrams showing a method of applying a pressure during the heat treatment process (d). In FIG. 3, the silicon nitride substrates 10 are interposed between ceramic plate members 14 such as boron nitride BN and loaded with a press weight 16. Other than boron nitride, the plate member 14 may be made of any material, which does not affect composition or the like of the silicon nitride substrate during the heat treatment process. Generally, boron nitride BN is suitably used among materials readily available. For the press weight 16, silicon nitride is preferably used, however, metal having a high melting point such as tungsten or molybdenum may also be used. Referring to FIG. 4, a hot press 18 is used instead of the press weight 16 to apply a load.

Figure 5:
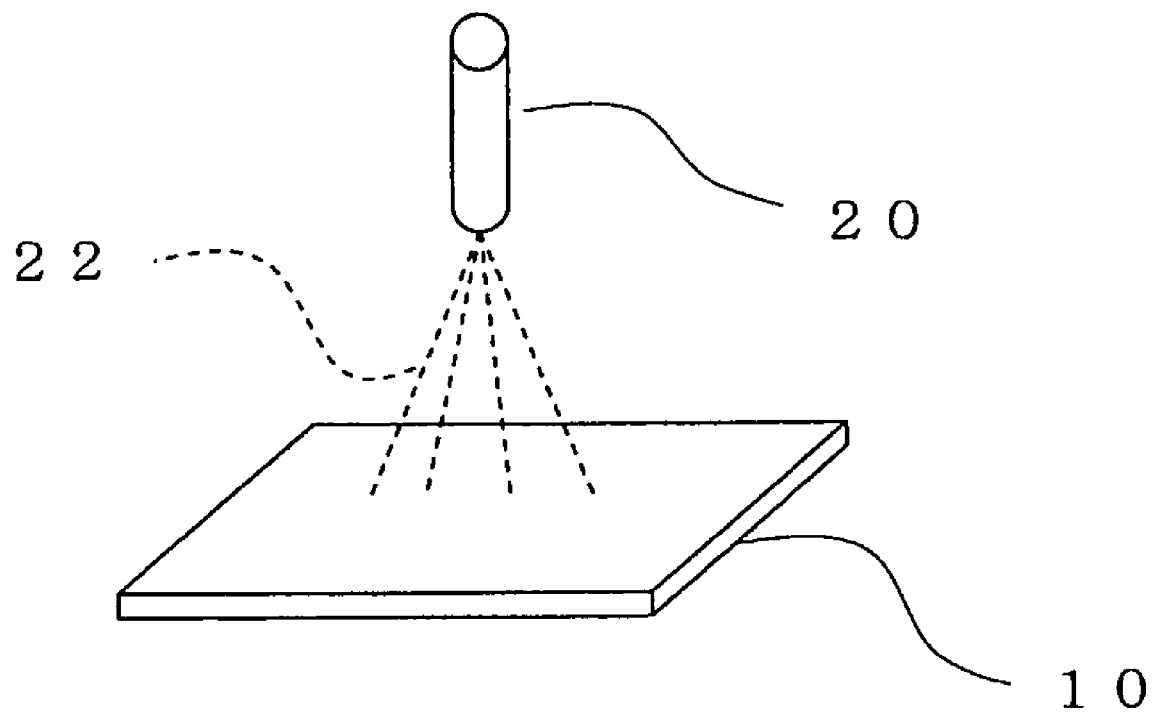
FIG. 5 is an illustrative diagram showing a blast process of FIG. 2.

FIG. 5 is an illustrative diagram showing the aforementioned blast process. In FIG. 5, abrasive particles 22 are blasted from a nozzle 20 onto the surface of the silicon nitride substrate 10 after the heat treatment to grind the surface of the silicon nitride substrate 10.

Figure 6A:
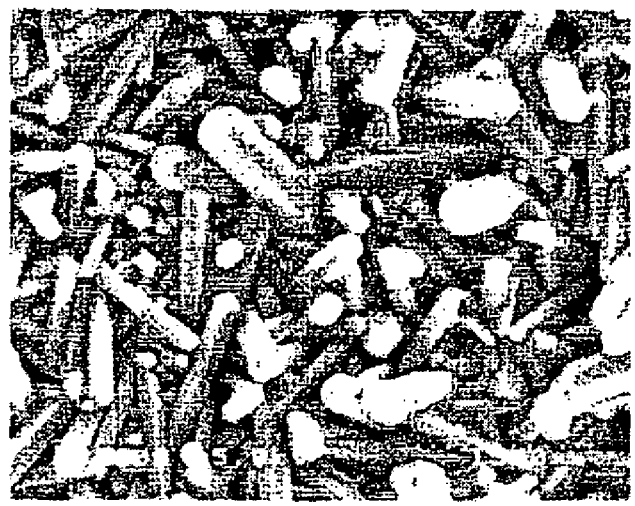
FIGS. 6A and 6B are electron microscope pictures showing a surface of a silicon nitride substrate before and after the blast process of FIG. 2.
Figure 6B:

FIGS. 6A and 6B are electron microscope pictures illustrating the surface of the silicon nitride substrate before and after the blast process. FIG. 6A shows a surface of the silicon nitride substrate before the blast process, and FIG. 6B shows a surface of the silicon nitride substrate after the blast process. It can be seen that, after the blast process in which the abrasive particles 22 are blasted to perform a grinding, columnar grains having a large size on the substrate surface are grinded, and then roughness of the substrate surface decreases.

The silicon nitride substrate manufactured as described above exhibits superior properties such as high bending strength, a high adhesion property with the metal circuit plate and the metal heat sink plate, high fracture toughness. Therefore, the silicon nitride substrate can be used in a circuit board for a high-frequency transistor or a power semiconductor module, various substrates such as multi-chip module circuit board, a thermal conduction plate for a Peltier device, or various electronic components such as a heat sink for various heat generating elements. If the silicon nitride substrate according to the present embodiment is employed in, for example, a substrate for mounting a semiconductor device, it is possible to prevent cracks on the substrate in a bonding process of the silicon nitride substrate, the metal circuit board, and the metal heat sink plate; in a process of manufacturing a power semiconductor module; or when the substrate is subjected to a repetitive heat cycle accompanied by operation of a power semiconductor module. Therefore, it is possible to provide a substrate having thermal shock resistance and heat cycle resistance.

A silicon nitride circuit board is manufactured by bonding a copper circuit board or an aluminum circuit board, which is a metal circuit plate or a metal heat sink plate, to one or both surfaces of the silicon nitride substrate according to the present embodiment using a direct bonding copper (DBC) method or an active metal soldering method or the like. A typical construction of the silicon nitride circuit board according to the present invention is obtained by bonding the metal circuit plate to one surface of the silicon nitride substrate according to the present embodiment, and bonding the metal heat sink plate to the other surface. In the DBC method, the silicon nitride substrate and the copper circuit board or an aluminum circuit board are heated within an inert gas or nitride atmosphere at a temperature higher than a process temperature, and the resultant liquid phase of Cu—O or Al—O eutectic compounds is used as an adhesive to directly bond a circuit board to one or both surface of the silicon nitride substrate through an eutectic compound layer. In the active metal brazing material method, a copper circuit board or an aluminum circuit board is bonded to one or both surface of the silicon nitride substrate by way of a heat and press process within an inert gas or vacuum atmosphere through a brazing material layer obtained by mixing or alloying active metal such as titanium Ti, zirconium Zr, or hafnium Hf with metal such as argentine Ag or copper Cu, which makes low melting point alloy with the active metal. After bonding the circuit board, the copper circuit board or the aluminum circuit board on the silicon nitride substrate is etched to form a circuit pattern, and then, an Ni—P plating is performed on the copper circuit board or the aluminum circuit board having a circuit pattern, and thus a silicon nitride circuit board is manufactured.

In addition, it is possible to manufacture a desired semiconductor module by mounting semiconductor devices on the silicon nitride circuit board.

Although the exemplary embodiment of the invention has been described above, many changes and modifications will become apparent to those skilled in the art in view of the foregoing description which is intended to be illustrative and not limiting of the invention defined in the appended claims.

EXAMPLES

Now, experimental examples corresponding to the aforementioned embodiments will be described hereinafter, however, the present invention is not intended to be limited thereby.

First Example

First Example corresponds to the first embodiment.

A silicon nitride substrate was manufactured based on the manufacturing method illustrated in FIG. 2, and its material properties were measured. Each item of manufacturing conditions such as the additive amount of magnesium oxide MgO, the additive amount of yttrium oxide $Y_2O_3$, a heat treatment temperature in the heat treatment process, pressure, whether or not the silicon nitride substrates are stacked, and the thickness of the silicon nitride substrate was established as shown in Table 1 (examples 1 to 10). In the Table 1, "Yes" means that the silicon nitride substrates are stacked. In the condition where the substrates are not stacked ("No" in the Table 1), a heat treatment process is performed on a single silicon nitride substrate interposed between two boron nitride BN plate members 14.

Measured material properties of the silicon nitride substrate were a degree of orientation, warpage, surface roughness, bending strength, a Weibull coefficient, fracture toughness, a heat conduction rate, and a heat cycle test result. Specifically, whether each of the warpage, the surface roughness, the bending strength, and the fracture toughness are within a predetermined range (warpage: 2 μm/mm or less, surface roughness: 0.44 μm or less, bending strength: 790 MPa or more, and fracture toughness: 6 $MPam^{1/2}$ or more) was determined.

As a comparative example, several extra silicon nitride substrates were also manufactured under manufacturing conditions different from the first example, and their material properties were similarly measured and determined. The results are shown in Tables 2-1,2-2 (Comparative Examples 1 to 13).

In the material properties, the degrees of orientation on the surface and inside of the substrate were calculated based on X-ray diffraction beam intensities using the Equation 1. In addition, as described above, the substrate surface refers to the outermost surface of the silicon nitride substrate obtained after the heat treatment process (d) or the surface obtained by grinding as deep as 10% or less of the substrate thickness from the outermost surface. Here, the outermost surface means the surface obtained after the heat treatment process (d), and the surface obtained by grinding as deep as 10% or less of the substrate thickness means the surface obtained after the blast process (e). However, since the degree of orientation is not significantly changed from the outermost surface to the surface obtained by grinding as deep as 10% or less of the substrate thickness, the degree of orientation may be measured on either of the outermost surface or the surface obtained by grinding as deep as 10% or less of the substrate thickness. In the present example, the degree of orientation was measured on the surface obtained by grinding as deep as 10% or less of the substrate thickness from the outermost surface (i.e., the surface obtained after the blast process (e)). The degree of orientation inside the substrate was measured on the surface obtained by grinding as deep as 20% or more and 80% or less of the substrate thickness from the substrate surface. Since the degree of orientation inside the substrate can be equally measured on either surface, the degree of orientation was measured on one surface in the example. It is to be noted that, although the substrate surface was grinded in order to measure the degree of orientation inside the substrate in the present example, the substrate surface is not grinded for that purpose when manufacturing a silicon nitride substrate according to the present invention.

Figure 7A:
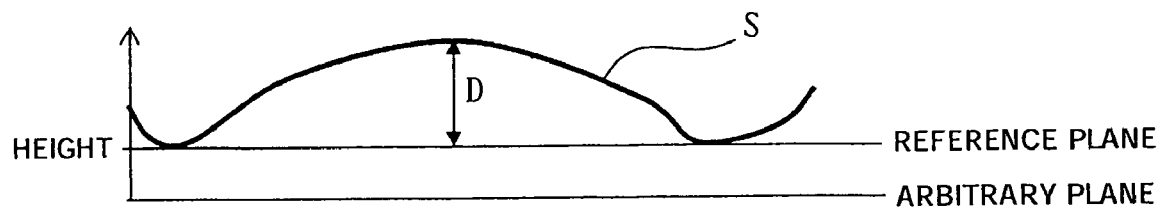
FIGS. 7A and 7B are illustrative diagrams showing a method of measuring warpage.
Figure 7B:
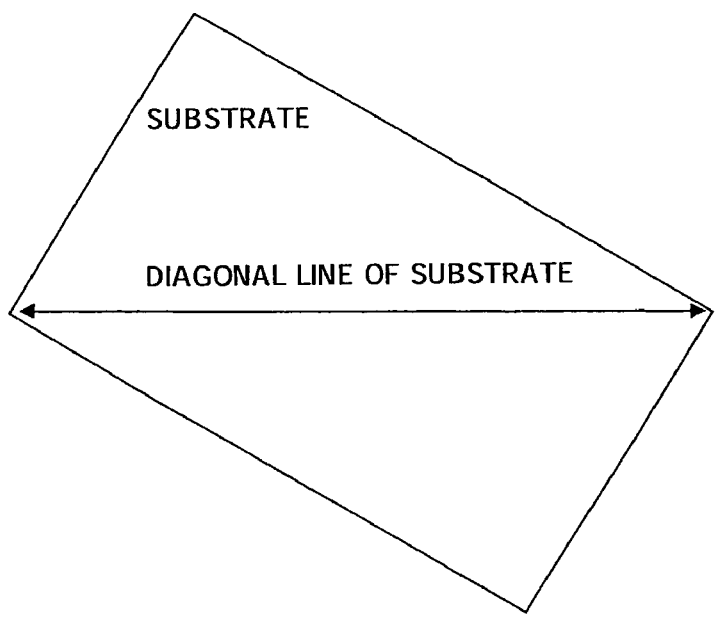

The warpage was measured using a 3-dimensional laser meter (trade name: LT-8100, manufactured by KEYENCE). FIGS. 7A and 7B are illustrative diagrams showing a method of measuring warpage. Referring to FIG. 7A, a distance from a suitably selected arbitrary plane to the substrate surface S was measured using a 3-D laser measuring instrument, and then a plane including two points having the shortest distance was selected as a reference plane. Subsequently, the height D of the highest point having largest height (distance) from the reference plane was defined as a warpage amplitude. In addition, as shown in FIG. 7B, the measurement of the distance from the arbitrary plane to the substrate surface S was performed on a diagonal line of the silicon nitride substrate. A warpage amount was obtained by dividing the warpage amplitude by a scanning distance (i.e., a diagonal length shown in FIG. 7B).

The surface roughness was measured for several arbitrary locations on the substrate surface using a surface roughness meter in accordance with a standard JIS-B0601, then an arithmetic mean value of roughness Ra was obtained.

The bending strength was measured by a three-point bending test in accordance with a standard JIS-B1601. Specifically, a specimen of the silicon nitride substrate having a width of 4 mm was prepared, and set on a three-point bending jig having a support roll distance of 7 mm. Then, a load was applied at a crosshead speed of 0.5 mm/min, and a load applied to the specimen at the time point of breakdown was used to calculate the bending strength.

The Weibull coefficient was obtained by drawing a Weibull plot by plotting $\ln\ln(1-F)^{-1}$ with respect to $\ln\sigma$ based on the bending strength test result in accordance with a standard JIS-R1625 and calculating an inclination of the plot. Here, σ denotes bending strength, and F denotes an accumulative breakdown probability.

The fracture toughness was measured using an IF method in which a Vickers indenter was pressed into the side face of the silicon nitride substrate with a predetermined load (e.g., in this example, 2 kgf (19.6N)) in accordance with a standard JIS-R1607. In this case, the Vickers indenter was pressed into the side face such that a diagonal line of Vickers indentation is perpendicular to the thickness direction of the silicon nitride substrate. The surface used to measure fracture toughness was obtained by cutting out the silicon nitride substrate and then performing a mirror-polishing on the obtained surface.

The heat conduction rate was measured in accordance with a standard JIS-R1611 by cutting out a measurement specimen having a width of 5 mm from the silicon nitride substrate.

The heat cycle test was performed by repeating a heating/cooling cycle including cooling at −55 degree C. for 20 minutes, annealing at a room temperature for 10 minutes, heating at 150 degree C. for 20 minutes 3,000 times, and then, determining pass or fail based on whether or not breakdown of the silicon nitride substrate or exfoliation of the metal circuit plate or the metal heat sink plate is generated. Here, the furnace (trade name: TSA-101S-W, manufactured by ESPEC Co.) was used to perform the heating/cooling cycle.

[Table 1]
[Tables 2-1,2-2]

As shown in Table 1, a silicon nitride substrate having a thickness of 0.1 to 1.0 mm was manufactured under the conditions that the additive amount of magnesium oxide is 3 to 4 wt %, the additive amount of yttrium oxide $Y_2O_3$ is 2 to 5 wt %, a heat treatment temperature in the heat treatment process is 1,550 to 1,700 degree C., a pressure is 0.5 to 6.0 kPa and substrates are stacked. The manufactured silicon nitride substrate exhibits satisfactory material properties including the degree of orientation of the substrate surface being within the range: 0.33 or less, the degree of orientation inside the substrate being within the range: 0.16 to 0.33, the surface roughness being within the range: 44 μm or less, the warpage being within the range: 2 μl/mm or less, the bending strength being within the range: 790 MPa or more, the fracture toughness being within the range: 6 MPam$^{1/2}$ or more. In addition, it is recognized that the Weibull coefficient was also satisfactory being within the range: 15 or more, and a variation of the bending strength was also small. As a result, even in a heat cycle test, all specimens were determined to pass without breakdown of the silicon nitride substrate or exfoliation of the metal circuit plate or the metal heat sink plate.

In a heat treatment process, since each outer surface of the uppermost and lowermost substrates out of a plurality of stacked silicon nitride substrates makes contact with a corresponding plate member 14, vaporization of the sintering additive such as MgO or $Y_2O_3$ is promoted on the contact surface with the plate member 14. However, since each inner surface of the uppermost and lowermost substrates also makes contact with other silicon nitride substrates, vaporization is prevented on these contact surfaces, and thus material properties are not significantly degraded. The reason why vaporization of the sintering additive is promoted on the contact surface with the plate member 14 will be described later.

On the other hand, as shown in Table 2-1, a silicon nitride substrate having a thickness of 0.32 mm was manufactured as a comparative example 1 under the conditions that the additive amount of MgO is 3 wt %, the additive amount of $Y_2O_3$ is 2 wt %, and a heat treatment is not performed. The manufactured silicon nitride substrate exhibited high warpage as much as 2.9 μm/mm. This is because the warpage of the silicon nitride substrate could not be restrained since a heat treatment was not performed. As a result, exfoliation of the metal circuit plate or the metal heat sink plate was generated in the heat cycle test.

As a comparative example 2, a silicon nitride substrate having a thickness of 0.32 mm was manufactured under the conditions that the additive amount of MgO is 3 wt %, the additive amount of $Y_2O_3$ is 2 wt %, the heat treatment temperature is 1,450 degree C., the pressure is 2.2 kPa, and the substrates are stacked. While the heat treatment was performed unlike the comparative example 1, the temperature was low. Therefore, the warpage increased to 2.5 μm/mm. As a result, exfoliation of the metal circuit plate or the metal heat sink plate was generated in the heat cycle test.

As a comparative example 3, a silicon nitride substrate having a thickness of 0.32 mm was manufactured under the conditions that the additive amount of MgO is 3 wt %, the additive amount of $Y_2O_3$ is 2 wt %, the heat treatment temperature is 1,800 degree C., the pressure is 2.4 kPa, and the substrates are stacked. In the manufactured silicon nitride substrate, the degree of orientation increased to 0.34, and the surface roughness on the substrate surface increased to 0.45 μm. This is because growth of columnar grains of silicon nitride is promoted by a high temperature heat treatment, and the content of columnar grains having a large longitudinal length increases. As a result, exfoliation of the metal circuit plate or the metal heat sink plate was generated in the heat cycle test. A silicon nitride substrate of a comparative example 4 was manufactured by changing the additive amount of $Y_2O_3$ to 3 wt % and the pressure to 2.6 kPa unlike the comparative example 3, and a silicon nitride substrate of a comparative example 5 was manufactured by changing the additive amount of MgO to 4 wt % and the pressure to 1.9 kPa unlike the comparative example 3. In both comparative examples 4 and 5, the heat treatment temperature increased to 1,800 degree C., the degree of orientation of the substrate surface increased to 0.38 in the comparative example 4 and to 0.35 in the comparative example 5, and the surface roughness increased to 0.46 μm in the comparative example 4 and at 0.47 μm in the comparative example 5. As a result, exfoliation of the metal circuit plate or the metal heat sink plate was generated in the heat cycle test.

As a comparative example 6, a silicon nitride substrate having a thickness of 0.32 mm was manufactured under the conditions that the additive amount of MgO is 3 wt %, the additive amount of $Y_2O_3$ is 2 wt %, the heat treatment temperature is 1,600 degree C., the pressure is 6.5 kPa, and the substrates was stacked. In the manufactured silicon nitride substrate, the degree of orientation increased to 0.35, and the surface roughness increased to 0.45 μm on the substrate surface. This is because, since the pressure increased to 6.5 kPa during the heat treatment, vaporization of the sintering additive MgO or $Y_2O_3$ is restrained on the contact surfaces between the silicon nitride substrates, and growth of columnar grains of silicon nitride is promoted, and thus the content of columnar grains having a long longitudinal length increases. As a result, exfoliation of the metal circuit plate or the metal heat sink plate was generated in the heat cycle test.

As a comparative example 7, a silicon nitride substrate having a thickness of 0.32 mm was manufactured under the conditions that the additive amount of MgO is 3 wt %, the additive amount of $Y_2O_3$ is 2 wt %, the heat treatment temperature is 1,600 degree C., no pressure is applied, and the substrates are stacked. Since there was no pressure during the heat treatment process, the effect of preventing warpage was insufficient, and the warpage increased to 3.0 μm/mm. As a result, exfoliation of the metal circuit plate or the metal heat sink plate was generated in the heat cycle test.

As a comparative example 8, a silicon nitride substrate having a thickness of 0.32 mm was manufactured under the conditions that the additive amount of MgO is 3 wt %, the additive amount of $Y_2O_3$ is 3 wt %, the heat treatment temperature is 1,600 degree C., the pressure is 2.1 kPa, and the substrates is not stacked. In the manufactured silicon nitride substrate, the bending strength and the fracture toughness decrease to 780 MPa and 5.9 $MPam^{1/2}$, respectively. This is because, since the silicon nitride substrates are not stacked in the heat treatment process, vaporization of the sintering additive MgO or $Y_2O_3$ is promoted, and growth of columnar grains of silicon nitride is restrained particularly inside the silicon nitride substrate, and thus the content of columnar grains having a short longitudinal length increases. As a result, in the comparative example, a degree of orientation inside the silicon nitride substrate decreases to 0.15. Accordingly, breakdown (e.g., cracks) of the silicon nitride substrate is generated in the heat cycle test. In the comparative example, a single silicon nitride substrate is interposed between two boron nitride plate members 14. Since the boron nitride has a density of about 80% and has a number of voids, it is guessed that the sintering additive vaporized from the silicon nitride substrate during the heat treatment process is absorbed into the boron nitride members or vaporized to an atmosphere through the boron nitride members.

As a comparative example 9, a silicon nitride substrate having a thickness of 0.32 mm was manufactured under the conditions that the additive amount of MgO is 3 wt %, the additive amount of $Y_2O_3$ is 3 wt %, the heat treatment temperature is 1,600 degree C., no pressure is applied, and the substrates are not stacked. Since there was no pressure in the heat treatment process, the warpage increases to 3.2 μm/mm. Since the silicon nitride substrates are not stacked, the degree of orientation inside the silicon nitride substrate decreased to 0.15, and the bending strength decreases to 788 MPa. As a result, exfoliation of the metal circuit plate or the metal heat sink plate was generated in the heat cycle test.

As a comparative example 10, a silicon nitride substrate having a thickness of 0.32 mm was manufactured under the conditions that the additive amount of MgO is 3 wt %, the additive amount of $Y_2O_3$ is 1 wt %, the heat treatment temperature is 1,600 degree C., a pressure is 3.0 kPa, and the substrates are stacked. In the manufactured silicon nitride substrate, the degree of orientation inside the manufactured silicon nitride substrate decreased to 0.14, and also both of the bending strength and the fracture toughness decreased to 734 MPa and 5.1 $MPam^{1/2}$, respectively. This is because, since the additive amount of $Y_2O_3$ is small (1 wt %), growth of columnar grains of silicon nitride is restrained particularly inside the silicon nitride substrate, and the content of columnar grains having a short longitudinal length increases. Accordingly, in the comparative example, the degree of orientation inside the silicon nitride substrate decreases to 0.14. As a result, breakdown (cracks) of the silicon nitride substrate is generated in the heat cycle test.

As a comparative example 12 (Table 2-2), a silicon nitride substrate having a thickness of 0.32 mm was manufactured under the conditions that the additive amount of MgO is 2 wt %, the additive amount of $Y_2O_3$ is 2 wt %, the heat treatment temperature is 1,600 degree C., a pressure is 3.5 kPa, and the substrates are stacked. Similar to the comparative example 10, the degree of orientation inside the silicon nitride substrate decreased to 0.14, and the bending strength and the fracture toughness decreased to 767 MPa and 5.8 $MPam^{1/2}$, respectively. This is because, since the additive amount of MgO functioning as a sintering additive is small (2 wt %), growth of columnar grains of silicon nitride is restrained particularly inside the silicon nitride substrate, and the content of columnar grains having a short longitudinal length increases. Accordingly, in the comparative example, the degree of orientation inside the silicon nitride substrate decreases to 0.14. As a result, breakdown (cracks) of the silicon nitride substrate is generated in the heat cycle test.

When the degree of orientation inside the substrate is smaller than 0.16 as the comparative examples 8, 9, 10, and 12, the ratio of columnar grains having a long length decreases, and the bending strength and the fracture toughness decrease, and thus the silicon nitride substrate may become susceptible to cracks during a bonding process of the silicon nitride substrate to the metal circuit plate and the metal heat sink plate, or a heat cycle accompanied by operation of a power semiconductor module.

As a comparative example 11 (Table 2-2), a silicon nitride substrate having a thickness of 0.32 mm was manufactured under the conditions that the additive amount of MgO is 3 wt %, the additive amount of $Y_2O_3$ is 6 wt %, the heat treatment temperature is 1,600 degree C., a pressure is 2.1 kPa, and the substrates are stacked. In the manufactured silicon nitride substrate, the degree of orientation increases both on the surface of the substrate and inside the substrate to 0.39 and 0.34, respectively, and the surface roughness on the substrate surface increases to 0.46 μm. This is because, since the additive amount of $Y_2O_3$ functioning as a sintering additive is large at 6 wt %, growth of columnar grains of silicon nitride is promoted, and the content of columnar grains having a long longitudinal length increases. As a result, exfoliation of the metal circuit plate or the metal heat sink plate was generated in the heat cycle test.

As a comparative example 13 (Table 2-2), a silicon nitride substrate having a thickness of 0.32 mm was manufactured under the conditions that the additive amount of MgO is 5 wt %, the additive amount of $Y_2O_3$ is 3 wt %, the heat treatment temperature is 1,600 degree C., a pressure is 2.3 kPa, and the substrates are stacked. Also in the manufactured silicon nitride substrate, the degree of orientation increased both on the surface of the substrate and inside the substrate to 0.40 and 0.35, respectively, and the surface roughness of the substrate surface increased to 0.45 μm. This is because, since the additive amount of MgO functioning as a sintering additive increases to 5 wt %, growth of columnar grains of silicon nitride is promoted, and the content of columnar grains having a long longitudinal length increases. As a result, exfoliation of the metal circuit plate or the metal heat sink plate was generated in the heat cycle test.

When the degree of orientation inside the substrate is larger than 0.33 as in the comparative examples 11 and 13, the degree of orientation fa on the surface of the silicon nitride substrate also increases. When the degree of orientation is large both on the surface of the substrate and inside the substrate, grain growth is processed on the entire substrate, and thus, a coarse defect can be easily generated. Since this defect may serve as a start point to generate the breakdown or to make the breakdown easily progress, the bending strength of the substrate decreases.

As described above, when the silicon nitride substrate is manufactured under the conditions specified in Table 1, the degree of orientation and other material properties are within the ranges specified in Table 1, and thus, breakdown of the silicon nitride substrate, or exfoliation of the metal circuit plate or the metal heat sink plate is not generated. However, when any item of the manufacturing conditions is not within the range, breakdown of the silicon nitride substrate, or exfoliation of the metal circuit plate or the metal heat sink plate may be generated.

Second Example

Second Example corresponds to the second embodiment.

A silicon nitride substrate was manufactured based on the manufacturing method illustrated in FIG. 2, and its material properties were measured. Each item of the manufacturing conditions such as the additive amount of magnesium oxide MgO, the additive amount of yttrium oxide $Y_2O_3$, a total additive amount of MgO and $Y_2O_3$, a heat treatment temperature in the heat treatment process, pressure, whether or not the silicon nitride substrates are stacked, and the thickness of the silicon nitride substrate was established as shown in Table 3 (examples 11 to 20). In the Table 3, "Yes" means that the silicon nitride substrates are stacked. In the condition where the substrates are not stacked ("No" in the Table 3), a heat treatment process is performed on a single silicon nitride substrate interposed between two boron nitride BN plate members 14.

Measured material properties of the silicon nitride substrate were a variation coefficient of magnesium on the surface of the silicon nitride substrate, a content of magnesium oxide MgO, a content of yttrium oxide $Y_2O_3$, a ratio of contents MgO/$Y_2O_3$, a total content of MgO and $Y_2O_3$, warpage, bending strength, a Weibull coefficient, fracture toughness, a heat conduction rate and heat shock test result. Specifically, whether each of the warpage, the bending strength, and the fracture toughness is within a predetermined range (warpage: 2 μm/mm or less, bending strength: 820 MPa or more, and fracture toughness: 6 MPam$^{1/2}$ or more) was determined.

As a comparative example, several extra silicon nitride substrates were also manufactured under manufacturing conditions different from the second example, and their material properties were similarly measured and determined. The results are shown in Table 4 (Comparative Examples 14 to 26).

In the material properties, the variation coefficient of magnesium was obtained by performing an EMPA analysis on the substrate surface as described above. In addition, as described above, the substrate surface refers to the outermost surface of the silicon nitride substrate or the surface obtained by grinding as deep as 10% or less of the substrate thickness (15 μm at maximum) from the outermost surface. Here, the outermost most surface means the surface obtained after the heat treatment, and the surface obtained by grinding as deep as 10% or less of the substrate thickness (15 μm at maximum) means the surface obtained after the blast process. Since the variation coefficient is not significantly changed from the outermost surface to the surface obtained by grinding as deep as 10% or less of the substrate thickness, the variation coefficient may be measured on either of the outermost surface or the surface obtained by grinding as deep as 10% or less of the substrate thickness. In the present example, the variation coefficient of magnesium was measured on the surface obtained by grinding as deep as 10% or less of the substrate thickness from the outermost surface (i.e., the surface obtained after the blast process).

The content of magnesium oxide MgO and the content of yttrium oxide $Y_2O_3$ were obtained by changing the phase of the nitride substrate into solution using microwave decomposition process and acid dissolution process, measuring the contents of magnesium and yttrium using ICP emission spectrometry, and then converting the contents in magnesium oxide equivalent and yttrium oxide equivalent. The ratio of contents MgO/$Y_2O_3$, and the total content of MgO and $Y_2O_3$ were calculated based on the obtained content of MgO and the content of $Y_2O_3$.

The warpage was measured using a 3-dimensional laser meter (trade name: LT-8100, manufactured by KEYENCE) similar to the example 1. A method of measuring the warpage is similar to that described in association with FIGS. 7A and 7B. A warpage amount was obtained by dividing the warpage amplitude by a scanning distance (i.e., a diagonal length shown in FIG. 7B).

The bending strength was measured by a three-point bending test in accordance with a standard JIS-R1601 in a similar way to that of the example 1.

The Weibull coefficient was obtained based on the bending strength test result in accordance with a standard JIS-R1625 in a similar way to that of the example 1.

The fracture toughness was measured using an IF method in accordance with a standard JIS-R1607 in a similar way to that of the example 1.

The heat conduction rate was measured in accordance with a standard JIS-R1611 by cutting out a measurement specimen having a width of 5 mm from the silicon nitride substrate in a similar way to that of the example 1.

In the heat shock test, the silicon nitride, first surface on which, a copper circuit plate is formed and second surface on which, a copper heat sink plate is formed, is kept at a temperature of 350 degree C. for 10 minutes and quickly cooled to a room temperature, and then whether there is a crack on the silicon nitride substrate or not is examined. This test was repetitively performed 10 times to determine whether the silicon nitride substrate is passed or failed based on whether or not a crack is generated. When the warpage is larger than 2.0 μm/mm, the substrate cannot be used for a silicon nitride circuit board. Therefore, there is no need to perform the heat shock test.

[Table 3]
[Table 4]

As shown in Table 3, a silicon nitride substrate having a thickness of 0.1 to 1.0 mm was manufactured under the conditions that the additive amount of magnesium oxide MgO is 3 to 4 wt %, the additive amount of yttrium oxide $Y_2O_3$ is 2 to 5 wt %, a heat treatment temperature is 1,550 to 1,700 degree C., a pressure is 0.5 to 6.0 kPa, and substrates are stacked. The manufactured silicon nitride substrate exhibits satisfactory material properties including the variation coefficient of magnesium being within the range: 0.20 or less, the content of MgO being within the range: 3.0 to 4.2 wt %, the content of $Y_2O_3$ being within the range: 2.0 to 5.0 wt %, the ratio of contents MgO/$Y_2O_3$ being within the range: 0.62 to 2.2, a total content of MgO and $Y_2O_3$ being within the range: 5.0 to 8.3 wt %, the warpage being within the range: 2 μm/mm or less, the bending strength being within the range: 820 MPa or more, and the fracture toughness being within the range: 6 MPam$^{1/2}$ or more. In addition, it is recognized that the Weibull coefficient was also satisfactory being within the range: 15 or more, and a variation of the bending strength was also small. As a result, even in a heat shock test, all specimens were determined to pass without breakdown of the silicon nitride substrate.

In a heat treatment process, since each outer surface of the uppermost and lowermost substrates out of a plurality of stacked silicon nitride substrates makes contact with a corresponding plate member 14, vaporization of the sintering additive such as MgO or $Y_2O_3$ is promoted on the contact surface with the plate member 14. However, since each inner surface of the uppermost and lowermost substrates also makes contact with other silicon nitride substrates, vaporization is prevented on these content surfaces, and thus material properties are not significantly degraded. The reason why vaporization of the sintering additive is promoted on the contact surface with the plate member 14 will be described later.

On the other hand, as shown in Table 4, a silicon nitride substrate having a thickness of 0.32 mm was manufactured as a comparative example 14 under the conditions that the additive amount of MgO is 3 wt %, the additive amount of $Y_2O_3$ is 2 wt %, and a heat treatment is not performed. The manufactured silicon nitride substrate exhibited high warpage as much as 2.9 μm/mm. This is because the warpage of the silicon nitride substrate could not be restrained since a heat treatment was not performed. Also, the variation coefficient of magnesium increased to 0.45, and the bending strength decreased to 812 MPa. This is because the heat treatment was not performed, and thus magnesium is not regularly distributed on the substrate surface.

As a comparative example 15, a silicon nitride substrate having a thickness of 0.32 mm was manufactured under the conditions that the additive amount of MgO is 3 wt %, the additive amount of $Y_2O_3$ is 2 wt %, the heat treatment temperature is 1,450 degree C., the pressure is 2.2 kPa, and the substrates are stacked. While the heat treatment was performed unlike the comparative example 14, the heat treatment temperature was low. Therefore, the warpage increased to 2.5 μm/mm.

As a comparative example 16, a silicon nitride substrate having a thickness of 0.32 mm was manufactured under the conditions that the additive amount of MgO is 3 wt %, the additive amount of $Y_2O_3$ is 2 wt %, the heat treatment temperature is 1,800 degree C., the pressure is 2.4 kPa, and the substrates are stacked. In the manufactured silicon nitride substrate, the variation coefficient of magnesium increased to 0.32, and the bending strength decreased to 795 MPa. This is because vaporization or segregation of grain boundary phase components on the surface of the silicon nitride substrate is promoted by a heat treatment at a high temperature. As a result, cracks were generated on the silicon nitride substrate in the heat shock test. A silicon nitride substrate of a comparative example 17 was manufactured by changing the additive amount of $Y_2O_3$ to 3 wt % and the pressure to 2.6 kPa unlike the comparative example 16, and a silicon nitride substrate of a comparative example 18 was manufactured by changing the additive amount of MgO to 4 wt % and the pressure to 1.9 kPa unlike the comparative example 16. In both comparative examples 17 and 18, the heat treatment temperature increased to 1,800 degree C., the variation coefficient of magnesium on the substrate surface increased to 0.42 in the comparative example 17 and to 0.27 in the comparative example 18, and the bending strength decreased to 812 MPa in the comparative example 17 and to 808 MPa in the comparative example 18. As a result, a crack was generated on the silicon nitride substrate in the heat shock test.

As a comparative example 19, a silicon nitride substrate having a thickness of 0.32 mm was manufactured under the conditions that the additive amount of MgO is 3 wt %, the additive amount of $Y_2O_3$ is 2 wt %, the heat treatment temperature is 1,600 degree C., the pressure is 6.5 kPa, and the substrates are stacked. In the manufactured silicon nitride substrate, the variation coefficient of magnesium on the substrate surface increased to 0.46, and the bending strength was low at 798 MPa. This is because, since the pressure during the heat treatment increased to 6.5 kPa, segregation of grain boundary phase components on the silicon nitride substrate was promoted. As a result, a crack was generated on the silicon nitride substrate in the heat shock test.

As a comparative example 20, a silicon nitride substrate having a thickness of 0.32 mm was manufactured under the conditions that the additive amount of MgO is 3 wt %, the additive amount of $Y_2O_3$ is 2 wt %, the heat treatment temperature is 1,600 degree C., no pressure is applied, and the substrates are stacked. Since there was no pressure during the heat treatment process, the effect of preventing warpage was insufficient, and the warpage increased to 3.0 μm/mm. In addition, the content of MgO decreased to 2.9 wt %, and the bending strength decreased to 802 MPa. This is because vaporization of the grain boundary phase components is promoted on the surface of the silicon nitride substrate due to the heat treatment without a pressure.

As a comparative example 21, a silicon nitride substrate having a thickness of 0.32 mm was manufactured under the conditions that the additive amount of MgO is 3 wt %, the additive amount of $Y_2O_3$ is 3 wt %, the heat treatment temperature is 1,600 degree C., the pressure is 2.1 kPa, and the substrates are not stacked. In the manufactured silicon nitride substrate, the variation coefficient of magnesium on the substrate surface increased to 0.23, the content of MgO decreased to 2.9 wt %, the bending strength decreased to 780 MPa, and the fracture toughness decreased to 5.9 $MPam^{1/2}$. This is because, since the silicon nitride substrates are not stacked in the heat treatment process, vaporization or segregation of grain boundary phase components is promoted. As a result, a crack was generated on the silicon nitride substrate in the heat shock test. In the comparative example, a single silicon nitride substrate is interposed between two boron nitride BN plate members 14. Since the boron nitride has a density of about 80% and has a number of voids, it is guessed that the sintering additive vaporized from the silicon nitride substrate during the heat treatment process is absorbed into the boron nitride members or vaporized to an atmosphere through the boron nitride members.

As a comparative example 22, a silicon nitride substrate having a thickness of 0.32 mm was manufactured under the conditions that the additive amount of MgO is 3 wt %, the additive amount of $Y_2O_3$ is 3 wt %, the heat treatment temperature is 1,600 degree C., a pressure is not applied, and the substrates are not stacked. Since there was no pressure in the heat treatment process, the warpage increased to 3.2 μm/mm. Since the silicon nitride substrates are not stacked in the heat treatment, vaporization or segregation of grain boundary phase components is promoted, the variation coefficient of magnesium on the substrate surface increased to 0.23, the content of MgO decreased to 2.9 wt %, and the bending strength decreased to 788 MPa.

As a comparative example 23, a silicon nitride substrate having a thickness of 0.32 mm was manufactured under the conditions that the additive amount of MgO is 3 wt %, the additive amount of $Y_2O_3$ is 1 wt %, the heat treatment temperature is 1,600 degree C., a pressure is 3.0 kPa, and the substrates are stacked. In the manufactured silicon nitride substrate, the bending strength and the fracture toughness decreased to 734 MPa and 5.1 $MPam^{1/2}$, respectively. This is because, since the additive amount of $Y_2O_3$ functioning as a sintering additive is small (1 wt %), the content of $Y_2O_3$ decreases to 1.0 wt %, a total content of MgO and $Y_2O_3$ decreases to 4.1 wt %, and the a ratio of contents MgO/$Y_2O_3$ increases to 3.2, grain boundary phase components, which have weak strength and have a number of defect, were formed. As a result, a crack is generated on the silicon nitride substrate in the heat shock test.

As a comparative example 24, a silicon nitride substrate having a thickness of 0.32 mm was manufactured under the conditions that the additive amount of MgO is 3 wt %, the additive amount of $Y_2O_3$ is 6 wt %, the heat treatment temperature is 1,600 degree C., the pressure is 2.1 kPa, and the substrates are stacked. In the manufactured silicon nitride substrate, since the additive amount of $Y_2O_3$ functioning as a sintering additive increased to 6 wt %, the content of $Y_2O_3$ also increased to 6.0 wt %, and a total content of MgO and $Y_2O_3$ increased to 9.1 wt %. In addition, since a ratio of contents $MgO/Y_2O_3$ decreased to 0.52, a number of grain boundary phase components having a weak strength were formed. As a result, a crack was generated on the silicon nitride substrate during the heat shock test.

As a comparative example 25, a silicon nitride substrate having a thickness of 0.32 mm was manufactured under the conditions that the additive amount of MgO is 2 wt %, the additive amount of $Y_2O_3$ is 2 wt %, the heat treatment temperature is 1,600 degree C., a pressure is 3.0 kPa, and the substrates are stacked. In the manufactured silicon nitride substrate, the bending strength and the fracture toughness decreased to 767 MPa and 5.8 $MPam^{1/2}$, respectively. This is because, since the additive amount of MgO functioning as a sintering additive decreased to 2 wt %, the content of MgO decreased to 2.1 wt %, and a total content of MgO and $Y_2O_3$ decreased to 4.1 wt %, and thus grain boundary phase components having a number of defects were formed. As a result, a crack was generated on the silicon nitride substrate during the heat shock test.

As a comparative example 26, a silicon nitride substrate having a thickness of 0.32 mm was manufactured under the conditions that the additive amount of MgO is 5 wt %, the additive amount of $Y_2O_3$ is 3 wt %, the heat treatment temperature is 1,600 degree C., a pressure is 2.3 kPa, and the substrates are stacked. In the manufactured silicon nitride substrate, since the additive amount of MgO functioning as a sintering additive increased to 5 wt %, the content of MgO also increased to 5.2 wt %, and a number of grain boundary phase components having weak strength were generated. As a result, a crack was generated on the silicon nitride substrate during the heat shock test.

As described above, when the silicon nitride substrate is manufactured under the conditions specified in Table 3, the variation coefficient of magnesium and other material properties are within the ranges specified in Table 3, and thus no crack or breakdown is generated on the silicon nitride substrate. However, it was found out that, when any item of the manufacturing conditions is not within the range, the warpage of the silicon nitride substrate increases, or breakdown of the silicon nitride substrate is generated.

TABLE 1

| | Item | Range | Example 1 | Example 2 | Example 3 | Example 4 | Example 5 | Example 6 | Example 7 | Example 8 | Example 9 | Example 10 |
|---|---|---|---|---|---|---|---|---|---|---|---|---|
| Manufacturing Condition | MgO Additive Amount | 3-4 wt % | 3 | 3 | 3 | 3 | 4 | 3 | 3 | 3 | 3 | 3 |
| | Y2O3 Additive Amount | 2-5 wt % | 2 | 3 | 4 | 5 | 2 | 2 | 2 | 2 | 2 | 2 |
| | Heat Treatment Temperature | 1550-1700° C. | 1600 | 1600 | 1600 | 1600 | 1600 | 1550 | 1700 | 1600 | 1600 | 1600 |
| | Pressure | 0.5-6.0 kPa | 1.9 | 2.2 | 2.2 | 2.3 | 2.1 | 6.0 | 1.9 | 0.5 | 2.3 | 2.1 |
| | Stacked | Yes | Yes | Yes | Yes | Yes | Yes | Yes | Yes | Yes | Yes | Yes |
| | Thickness | 0.1-1.0 mm | 0.32 | 0.32 | 0.32 | 0.32 | 0.32 | 0.32 | 0.32 | 0.15 | 0.2 | 0.84 |
| Degree of Orientation | Surface Degree of Orientation | ≦0.33 | 0.29 | 0.30 | 0.30 | 0.32 | 0.33 | 0.28 | 0.30 | 0.29 | 0.29 | 0.29 |
| | Inside Degree of Orientation | 0.16-0.33 | 0.19 | 0.21 | 0.28 | 0.29 | 0.21 | 0.18 | 0.20 | 0.22 | 0.21 | 0.18 |
| Properties | Warpage | ≦2 um/mm | 0.9 | 1.0 | 0.5 | 0.6 | 1.2 | 1.0 | 1.0 | 0.7 | 1.2 | 0.4 |
| | Surface Roughness | ≦0.44 um | 0.38 | 0.39 | 0.39 | 0.38 | 0.40 | 0.37 | 0.43 | 0.41 | 0.38 | 0.39 |
| | Bending Strength | ≧790 MPa | 864 | 864 | 835 | 832 | 849 | 841 | 853 | 842 | 834 | 845 |
| | Weibull Coefficient | ≧15 | 29 | 36 | 18 | 16 | 16 | 26 | 27 | 27 | 28 | 29 |
| | Fracture Toughness | ≧6 $MPam^{1/2}$ | 6.4 | 6.8 | 6.7 | 6.8 | 6.7 | 6.3 | 6.5 | 6.4 | 6.4 | 6.4 |
| | Heat Conduction Rate | ≧80 W/mK | 89 | 93 | 88 | 87 | 84 | 88 | 87 | 88 | 89 | 89 |
| | Heat Cycle Test Result | | Pass | Pass | Pass | Pass | Pass | Pass | Pass | Pass | Pass | Pass |
| Determination | Warpage | | Pass | Pass | Pass | Pass | Pass | Pass | Pass | Pass | Pass | Pass |
| | Surface Roughness | | Pass | Pass | Pass | Pass | Pass | Pass | Pass | Pass | Pass | Pass |
| | Bending Strength | | Pass | Pass | Pass | Pass | Pass | Pass | Pass | Pass | Pass | Pass |
| | Fracture Toughness | | Pass | Pass | Pass | Pass | Pass | Pass | Pass | Pass | Pass | Pass |

TABLE 2-1

| | Item | Comparative Example 1 | Comparative Example 2 | Comparative Example 3 | Comparative Example 4 | Comparative Example 5 |
|---|---|---|---|---|---|---|
| Manufacturing Condition | MgO Additive Amount | 3 | 3 | 3 | 3 | 4 |
| | Y2O3 Additive Amount | 2 | 2 | 2 | 3 | 2 |
| | Heat Treatment Temperature | No set value | 1450 | 1800 | 1800 | 1800 |
| | Pressure | No set value | 2.2 | 2.4 | 2.6 | 1.9 |
| | Stacked | No | Yes | Yes | Yes | Yes |
| | Thickness | 0.32 | 0.32 | 0.32 | 0.32 | 0.32 |
| Degree of Orientation | Surface Degree of Orientation | 0.28 | 0.28 | 0.34 | 0.38 | 0.35 |
| | Inside Degree of Orientation | 0.16 | 0.18 | 0.26 | 0.33 | 0.20 |
| Properties | Warpage | 2.9 | 2.5 | 1.0 | 0.7 | 0.7 |
| | Surface Roughness | 0.37 | 0.38 | 0.45 | 0.46 | 0.47 |
| | Bending Strength | 812 | 832 | 795 | 812 | 808 |

TABLE 2-1-continued

| | Item | | | | | |
|---|---|---|---|---|---|---|
| | Weibull Coefficient | 17 | 26 | 25 | 20 | 26 |
| | Fracture Toughness | 6.4 | 6.5 | 6.5 | 6.3 | 6.4 |
| | Heat Conduction | 89 | 93 | 95 | 104 | 86 |
| | Heat Cycle Test Result | Fail (Metal Plate Defoliation) | Fail (Metal Plate Defoliation) | Fail (Metal Plate Defoliation) | Fail (Metal Plate Defoliation) | Fail (Metal Plate Defoliation) |
| Determination | Warpage | Fail | Fail | Pass | Pass | Pass |
| | Surface Roughness | Pass | Pass | Fail | Fail | Fail |
| | Bending Strength | Pass | Pass | Pass | Pass | Pass |
| | Fracture Toughness | Pass | Pass | Pass | Pass | Pass |

| | Item | Comparative Example 6 | Comparative Example 7 | Comparative Example 8 | Comparative Example 9 | Comparative Example 10 |
|---|---|---|---|---|---|---|
| Manufacturing Condition | MgO Additive Amount | 3 | 3 | 3 | 3 | 3 |
| | Y2O3 Additive Amount | 2 | 2 | 3 | 3 | 1 |
| | Heat Treatment Temperature | 1600 | 1600 | 1600 | 1600 | 1600 |
| | Pressure | 6.5 | No set value | 2.1 | No set value | 3.0 |
| | Stacked | Yes | Yes | No | No | Yes |
| | Thickness | 0.32 | 0.32 | 0.32 | 0.32 | 0.32 |
| Degree of Orientation | Surface Degree of Orientation | 0.35 | 0.28 | 0.28 | 0.29 | 0.27 |
| | Inside Degree of Orientation | 0.24 | 0.16 | 0.15 | 0.15 | 0.14 |
| Properties | Warpage | 0.7 | 3.0 | 0.4 | 3.2 | 0.9 |
| | Surface Roughness | 0.45 | 0.41 | 0.38 | 0.40 | 0.38 |
| | Bending Strength | 798 | 802 | 780 | 788 | 734 |
| | Weibull Coefficient | 23 | 22 | 17 | 21 | 22 |
| | Fracture Toughness | 6.5 | 6.5 | 5.9 | 6.5 | 5.1 |
| | Heat Conduction | 92 | 91 | 88 | 89 | 90 |
| | Heat Cycle Test Result | Fail (Metal Plate Defoliation) | Fail (Metal Plate Defoliation) | Fail (Substrate Crack) | Fail (Metal Plate Defoliation) | Fail (Substrate Crack) |
| Determination | Warpage | Pass | Fail | Pass | Fail | Pass |
| | Surface Roughness | Fail | Pass | Pass | Pass | Pass |
| | Bending Strength | Pass | Pass | Fail | Fail | Fail |
| | Fracture Toughness | Pass | Pass | Fail | Pass | Fail |

TABLE 2-2

| | Item | Comparative Example 11 | Comparative Example 12 | Comparative Example 13 |
|---|---|---|---|---|
| Manufacturing Condition | MgO Additive Amount | 3 | 2 | 5 |
| | Y2O3 Additive Amount | 6 | 2 | 3 |
| | Heat Treatment Temperature | 1600 | 1600 | 1600 |
| | Pressure | 2.1 | 3.5 | 2.3 |
| | Stacked | Yes | Yes | Yes |
| | Thickness | 0.32 | 0.32 | 0.32 |
| Degree of Orientation | Surface Degree of Orientation | 0.39 | 0.28 | 0.40 |
| | Inside Degree of Orientation | 0.34 | 0.14 | 0.35 |
| Properties | Warpage | 0.9 | 1.3 | 1.1 |
| | Surface Roughness | 0.46 | 0.37 | 0.45 |
| | Bending Strength | 771 | 767 | 771 |
| | Weibull Coefficient | 14 | 24 | 13 |
| | Fracture Toughness | 6.4 | 5.8 | 6.3 |
| | Heat Conduction | 82 | 97 | 83 |
| | Heat Cycle Test Result | Fail (Metal Plate Defoliation) | Fail (Substrate Crack) | Fail (Metal Plate Defoliation) |

TABLE 2-2-continued

| Item | | Comparative Example 11 | Comparative Example 12 | Comparative Example 13 |
|---|---|---|---|---|
| Determination | Warpage | Pass | Pass | Pass |
| | Surface Roughness | Fail | Pass | Fail |
| | Bending | Fail | Fail | Fail |
| | Strength | | | |
| | Fracture Toughness | Pass | Fail | Pass |

TABLE 3

| | Item | Example 11 | Example 12 | Example 13 | Example 14 | Example 15 | Example 16 | Example 17 | Example 18 | Example 19 | Example 20 |
|---|---|---|---|---|---|---|---|---|---|---|---|
| Manufacturing Condition | MgO Additive Amount(wt %) | 3 | 3 | 3 | 3 | 4 | 3 | 3 | 3 | 3 | 3 |
| | Y2O3 Additive Amount(wt %) | 2 | 3 | 4 | 5 | 2 | 2 | 2 | 2 | 2 | 2 |
| | Total Additive Amount(wt %) | 5 | 6 | 7 | 8 | 6 | 5 | 5 | 5 | 5 | 5 |
| | Heat Treatment Temperature(° C.) | 1600 | 1600 | 1600 | 1600 | 1600 | 1550 | 1700 | 1600 | 1600 | 1600 |
| | Pressure(kPa) | 1.9 | 2.2 | 2.2 | 2.3 | 2.1 | 6.0 | 1.9 | 0.5 | 2.3 | 2.1 |
| | Stacked | Yes | Yes | Yes | Yes | Yes | Yes | Yes | Yes | Yes | Yes |
| | Thickness(mm) | 0.32 | 0.32 | 0.32 | 0.32 | 0.32 | 0.32 | 0.32 | 0.15 | 0.2 | 0.84 |
| Substrate Composition | Mg Variation Coefficient | 0.16 | 0.13 | 0.12 | 0.13 | 0.12 | 0.14 | 0.20 | 0.12 | 0.13 | 0.12 |
| | Content of MgO(wt %) | 3.1 | 3.2 | 3.1 | 3.1 | 4.2 | 3.1 | 3.1 | 3.1 | 3.0 | 3.1 |
| | Content of Y2O3(wt %) | 2.0 | 3.0 | 4.0 | 5.0 | 2.0 | 2.0 | 2.0 | 2.0 | 2.0 | 2.0 |
| | MgO/$Y_2O_3$ | 1.6 | 1.0 | 0.79 | 0.62 | 2.2 | 1.5 | 1.5 | 1.5 | 1.5 | 1.5 |
| | Total Content(wt %) | 5.1 | 6.2 | 7.1 | 8.1 | 6.2 | 5.1 | 5.1 | 5.1 | 5.0 | 5.1 |
| Properties | Warpage(μm/mm) | 0.9 | 1.0 | 0.5 | 0.6 | 1.2 | 1.0 | 1.0 | 0.7 | 1.2 | 0.4 |
| | Bending Strength(MPa) | 864 | 864 | 835 | 832 | 849 | 841 | 853 | 842 | 834 | 845 |
| | Weibull Coefficient | 29 | 36 | 18 | 16 | 16 | 26 | 27 | 27 | 28 | 29 |
| | Fracture Toughness(MPa·$m^{1/2}$) | 6.4 | 6.8 | 6.7 | 6.8 | 6.7 | 6.3 | 6.5 | 6.4 | 6.4 | 6.4 |
| | Heat Conduction Rate(W/mK) | 89 | 93 | 88 | 87 | 84 | 88 | 87 | 88 | 89 | 89 |
| | Heat Shock Test Result | Pass | Pass | Pass | Pass | Pass | Pass | Pass | Pass | Pass | Pass |
| Determination | Warpage | Pass | Pass | Pass | Pass | Pass | Pass | Pass | Pass | Pass | Pass |
| | Bending Strength | Pass | Pass | Pass | Pass | Pass | Pass | Pass | Pass | Pass | Pass |
| | Fracture Toughness | Pass | Pass | Pass | Pass | Pass | Pass | Pass | Pass | Pass | Pass |

TABLE 4

| | Item | Comparative Example 14 | Comparative Example 15 | Comparative Example 16 | Comparative Example 17 | Comparative Example 18 | Comparative Example 19 | Comparative Example 20 | Comparative Example 21 |
|---|---|---|---|---|---|---|---|---|---|
| Manufacturing Condition | MgO Additive Amount(wt %) | 3 | 3 | 3 | 3 | 4 | 3 | 3 | 3 |
| | Y2O3 Additive Amount(wt %) | 2 | 2 | 2 | 3 | 2 | 2 | 2 | 3 |
| | Total Additive Amount(wt %) | 5 | 5 | 5 | 6 | 6 | 5 | 5 | 6 |
| | Heat Treatment Temperature(° C.) | No set value | 1450 | 1800 | 1800 | 1800 | 1600 | 1600 | 1600 |
| | Pressure(kPa) | No set value | 2.2 | 2.4 | 2.6 | 1.9 | 6.5 | No set value | 2.1 |
| | Stacked | No | Yes | Yes | Yes | Yes | Yes | Yes | No |
| | Thickness(mm) | 0.32 | 0.32 | 0.32 | 0.32 | 0.32 | 0.32 | 0.32 | 0.32 |
| Substrate Composition | Mg Variation Coefficient | 0.45 | 0.13 | 0.32 | 0.42 | 0.27 | 0.46 | 0.20 | 0.23 |
| | Content of MgO (wt %) | 3.1 | 3.1 | 3.1 | 3.0 | 4.1 | 3.2 | 2.9 | 2.9 |
| | Content of Y2O3 (wt %) | 2.0 | 2.0 | 2.0 | 3.0 | 2.0 | 2.0 | 2.0 | 3.0 |
| | MgO/$Y_2O_3$ | 1.5 | 1.5 | 1.5 | 1.0 | 2.0 | 1.6 | 1.5 | 0.97 |
| | Total Content(wt %) | 5.1 | 5.1 | 5.1 | 6.0 | 6.1 | 5.2 | 4.9 | 5.9 |
| Properties | Warpage(μm/mm) | 2.9 | 2.5 | 1.0 | 0.7 | 0.7 | 0.7 | 3.0 | 0.4 |
| | Bending Strength (MPa) | 812 | 832 | 795 | 812 | 808 | 798 | 802 | 780 |
| | Weibull Coefficient | 17 | 26 | 25 | 20 | 26 | 23 | 22 | 17 |
| | Fracture Toughness (MPa·$m^{1/2}$) | 6.4 | 6.5 | 6.5 | 6.3 | 6.4 | 6.5 | 6.5 | 5.9 |
| | Heat Conduction Rate(W/mK) | 89 | 93 | 95 | 104 | 86 | 92 | 91 | 88 |
| | Heat Shock Test Result | — | — | Fail | Fail | Fail | Fail | — | Fail |
| Determination | Warpage | Fail | Fail | Pass | Pass | Pass | Pass | Fail | Pass |
| | Bending Strength | Fail | Pass | Fail | Fail | Fail | Fail | Fail | Fail |
| | Fracture Toughness | Pass | Pass | Pass | Pass | Pass | Pass | Pass | Fail |

TABLE 4-continued

|  | Item | Comparative Example 22 | Comparative Example 23 | Comparative Example 24 | Comparative Example 25 | Comparative Example 26 |
|---|---|---|---|---|---|---|
| Manufacturing Condition | MgO Additive Amount(wt %) | 3 | 3 | 3 | 2 | 5 |
|  | Y2O3 Additive Amount(wt %) | 3 | 1 | 6 | 2 | 3 |
|  | Total Additive Amount(wt %) | 6 | 4 | 9 | 4 | 8 |
|  | Heat Treatment Temperature(° C.) | 1600 | 1600 | 1600 | 1600 | 1600 |
|  | Pressure(kPa) | No set value | 3.0 | 2.1 | 3.5 | 2.3 |
|  | Stacked | No | Yes | Yes | Yes | Yes |
|  | Thickness(mm) | 0.32 | 0.32 | 0.32 | 0.32 | 0.32 |
| Substrate Composition | Mg Variation Coefficient | 0.23 | 0.17 | 0.19 | 0.19 | 0.20 |
|  | Content of MgO (wt %) | 2.9 | 3.1 | 3.1 | 2.1 | 5.2 |
|  | Content of Y2O3 (wt %) | 3.0 | 1.0 | 6.0 | 2.0 | 3.0 |
|  | MgO/Y$_2$O$_3$ | 0.97 | 3.2 | 0.52 | 1.0 | 1.7 |
|  | Total Content(wt %) | 5.9 | 4.1 | 9.1 | 4.1 | 8.2 |
| Properties | Warpage(μm/mm) | 3.2 | 0.9 | 0.9 | 1.3 | 1.1 |
|  | Bending Strength (MPa) | 788 | 734 | 771 | 767 | 771 |
|  | Weibull Coefficient | 21 | 22 | 14 | 24 | 13 |
|  | Fracture Toughness (MPa · m$^{1/2}$) | 6.5 | 5.1 | 6.4 | 5.8 | 6.3 |
|  | Heat Conduction Rate(W/mK) | 89 | 90 | 82 | 97 | 83 |
|  | Heat Shock Test Result | — | Fail | Fail | Fail | Fail |
| Determination | Warpage | Fail | Pass | Pass | Pass | Pass |
|  | Bending Strength | Fail | Fail | Fail | Fail | Fail |
|  | Fracture Toughness | Pass | Fail | Pass | Fail | Pass |

What is claimed is:

1. A silicon nitride substrate containing silicon nitride, wherein a degree of orientation representing an orientation ratio on a plane perpendicular to a thickness direction, determined by a ratio of X-ray diffraction beam intensity on a predetermined lattice surface of a grain of the silicon nitride is 0.33 or less on a surface; and the degree of orientation is 0.16 to 0.33 on a surface grinded as deep as 20% or more of a thickness of the substrate from a substrate surface; and warpage is 2.0 μm/mm or less.

2. The silicon nitride substrate according to claim 1, wherein the silicon nitride contains magnesium of 3 to 4 wt % as magnesium oxide MgO and yttrium of 2 to 5 wt % as yttrium oxide Y$_2$O$_3$.

3. A silicon nitride circuit board including a metal circuit plate bonded to one surface of the silicon nitride substrate according to claim 1, and a metal heat sink plate bonded to the other surface thereof.

4. A semiconductor module including the silicon nitride circuit board according to claim 3 and a semiconductor device mounted on the silicon nitride circuit board.

5. A silicon nitride substrate containing β-type silicon nitride, yttrium Y, and magnesium Mg, wherein a variation coefficient representing distribution of magnesium on a surface of the silicon nitride substrate is 0.20 or less, and warpage is 2.0 μm/mm or less.

6. The silicon nitride substrate according to claim 5, wherein a content of magnesium Mg is 3.0 to 4.2 wt % as magnesium oxide MgO, and a content of yttrium Y is 2.0 to 5.0 wt % as yttrium oxide Y$_2$O$_3$.

7. A silicon nitride circuit board including a metal circuit plate bonded to one surface of the silicon nitride substrate according to claim 5, and a metal heat sink plate bonded to the other surface thereof.

8. A semiconductor module including the silicon nitride circuit board according to claim 7 and a semiconductor device mounted on the silicon nitride circuit board.

* * * * *